United States Patent
Yu et al.

(10) Patent No.: US 7,050,222 B2
(45) Date of Patent: May 23, 2006

(54) METHODS AND DEVICES FOR HIGH POWER, DEPOLARIZED SUPERLUMINESCENT DIODES

(75) Inventors: Anthony W. Yu, Spencerville, MD (US); Stewart W. Wilson, Billerica, MA (US); Dennis Bowler, Sudbury, MA (US); Peter J. S. Heim, Washington, DC (US); Scott A. Merritt, McLean, VA (US)

(73) Assignee: Covega, Inc., Jessup, MD (US)

( * ) Notice: Subject to any disclaimer, the term of this patent is extended or adjusted under 35 U.S.C. 154(b) by 44 days.

(21) Appl. No.: 10/851,179

(22) Filed: May 24, 2004

(65) Prior Publication Data

US 2005/0052739 A1 Mar. 10, 2005

Related U.S. Application Data

(60) Provisional application No. 60/472,743, filed on May 23, 2003.

(51) Int. Cl.
*H10S 3/00* (2006.01)
*H01L 29/22* (2006.01)

(52) U.S. Cl. ......................... 359/344; 257/98
(58) Field of Classification Search ................ 359/344; 372/1, 50.22; 257/98
See application file for complete search history.

(56) References Cited

U.S. PATENT DOCUMENTS

| 5,223,722 | A | * | 6/1993 | Nagai et al. | 257/96 |
|---|---|---|---|---|---|
| 5,268,910 | A | * | 12/1993 | Huber | 372/6 |
| 5,324,964 | A | * | 6/1994 | Ackley et al. | 257/98 |
| 5,357,124 | A | * | 10/1994 | Kajiwara et al. | 257/95 |
| 5,432,806 | A | * | 7/1995 | Snitzer | 372/6 |
| 5,556,795 | A | * | 9/1996 | Morrison | 438/31 |
| 5,606,572 | A | * | 2/1997 | Swirhun et al. | 372/96 |
| 5,978,528 | A | * | 11/1999 | Fidric | 385/24 |
| 5,981,978 | A | * | 11/1999 | Mushiage et al. | 257/95 |
| 6,069,732 | A | * | 5/2000 | Koch et al. | 359/344 |
| 6,091,743 | A | * | 7/2000 | Yang | 372/6 |
| 6,097,743 | A | * | 8/2000 | Alphonse | 372/32 |
| 6,169,832 | B1 | * | 1/2001 | McLandrich | 385/43 |
| 6,184,542 | B1 | * | 2/2001 | Alphonse | 257/94 |
| 6,226,308 | B1 | * | 5/2001 | Samson et al. | 372/40 |
| 6,310,995 | B1 | | 10/2001 | Saini et al. | |
| 6,339,606 | B1 | * | 1/2002 | Alphonse | 372/50.1 |
| 2002/0181075 | A1 | * | 12/2002 | Fidric et al. | 359/334 |

(Continued)

FOREIGN PATENT DOCUMENTS

JP 08288541 A * 11/1996

OTHER PUBLICATIONS

Gerard A. Alphonse, Dean B. Gilbert, M. G. Harvey, Michael Ettenberg. High-Power Superluminescent Diodes. IEEE Journal of Quantum Electronics, vol. 24, No. 12, Dec. 1988. pp. 2454-2457.*

(Continued)

*Primary Examiner*—Jack Keith
*Assistant Examiner*—Ari M Diacou
(74) *Attorney, Agent, or Firm*—Potomac Patent Group, PLLC

(57) ABSTRACT

High power, low degree of polarization superluminescent diodes (SLDS) are described. A semiconductor optical amplifier (SOA) which amplifies light in substantially one polarizaton state can be used to create a SLD by combining the output from both sides of this polarization sensitive SOA in a manner which results in a depolarized output.

19 Claims, 6 Drawing Sheets

U.S. PATENT DOCUMENTS

| | | | |
|---|---|---|---|
| 2003/0043697 A1* | 3/2003 | Vakoc | 367/149 |
| 2003/0067678 A1* | 4/2003 | Shibata et al. | 359/344 |
| 2005/0012986 A1* | 1/2005 | Kakui | 359/333 |
| 2005/0161685 A1* | 7/2005 | Velez et al. | 257/85 |
| 2005/0185262 A1* | 8/2005 | Yun et al. | 359/344 |

OTHER PUBLICATIONS

C. S. Wang, W. H. Cheng, and C. J. Hwang, W. K. Burns and R. P. Moeller. High-power low-divergence superradiance diode. Applied Physics Letters—Oct. 1, 1982—vol. 41, Issue 7, pp. 587-589.*

Moeller, R. P.; Burns, W. K. Depolarised broadband source. Electronics Letters (ISSN 0013-5194), vol. 19, Mar. 3, 1983, p. 187, 188.*

S. Tai, K. Kojima, S. Noda, K. Kyuma, K. Hamanaka, T. Nakayama. All-fibre gyroscope using depolarised superluminescent diode. Electronics Letters (ISSN 0013-5194), vol. 22, May 8, 1986, p. 546, 547.*

Fengping Yan, Yi Yao, Shuisheng Jian, Hongjie Xu, Xinzhen Du, Weixu Zhang. Investigation of the Depolarized Single-mode Fiber Optic Gyroscope. SPIE vol. 2837. pp. 402-405.*

* cited by examiner

METHODS AND DEVICES FOR HIGH POWER, DEPOLARIZED SUPERLUMINESCENT DIODES

RELATED APPLICATION

This application is related to, and claims priority from, U.S. Provisional Patent Application Ser. No. 60/472,743 filed on May 23, 2003, entitled "Methods and Devices for High Power, Depolarized Superluminescent Diodes".

BACKGROUND

The present invention relates generally to methods for providing high power, depolarized superluminescent diodes (SLDs) and, more particularly, to providing high power, depolarized SLDs using one or more polarization sensitive semiconductor optical amplifiers (SOAs) in conjunction with a polarization beam combiner.

Optical technologies have evolved rapidly over the last two decades. Optical information communication technologies, for example, have evolved as the technology of choice for backbone information communication systems due to, among other things, their ability to provide large bandwidth, fast transmission speeds and high channel quality. Optical sensing and imaging technologies have also found widespread acceptance in applications ranging from aerospace to medical. Various types of optical light sources have been used in optical technologies. Three such semiconductor-based sources are the light emitting diode (LED), the laser diode (LD) and the superluminescent diode (SLD). It should be noted that the SLD is also often referred to as a superluminescent LED (SLED). LEDs produce light through spontaneous emission of photons when a current is passed through them. Spontaneous emission refers to the random generation of photons within an active layer of the LED, these photons are emitted in random directions. This process causes the light output from LEDs to be incoherent, have a broad spectral width and have a wide output beam pattern. Laser diodes, on the other hand, produce light through stimulated emission when a current is passed through them. In the LD, photons initially produced by spontaneous emission interact with the laser material to produce additional photons. This process occurs within the active area of the LD referred to as the laser cavity. The emission process and the physical characteristics of the diode cause the light output to be coherent, have a narrow spectral width and have a comparatively narrow output beam pattern. The output power from a LD is typically much higher than from an LED. SLDs produce light through a combination of both spontaneous emission and stimulated emission when a current is passed through them. Spontaneous emission of photons is amplified within the SLD active layer to generate "superluminescent" or amplified spontaneous emission (ASE) output power. In this manner the SLD has low-coherence and broad spectral width similar to an LED, yet high output power and narrow output beam pattern (spatial coherence) similar to a LD. Because of this desirable combination of features, SLDs are extremely useful optical sources for a range of applications including, for example, optical coherence tomography, optical fiber gyroscopes and optical fiber sensor systems.

The optical output power from an SLD is typically linearly polarized. There are many applications such as in optical imaging and optical fiber sensors where a depolarized broadband optical source is desired to reduce or eliminate unwanted polarization sensitivity. Several options currently exist for achieving a depolarized broadband optical source. Optical fiber amplifiers based on either Erbium or Ytterbium, for example, provide a depolarized output signal since the gain medium is intrinsically polarization independent. However, fiber amplifiers are larger and more expensive than semiconductor-based SLD sources. Also, fiber amplifiers operate over a much more limited range of wavelengths compared to SLDs. Alternatively, the degree of polarization (DOP) of the SLD output can be reduced using special depolarizing optical elements such as a wedge depolarizer, Lyot depolarizer or various types of time-domain polarization scramblers. However, the efficacy of these depolarizing approaches depends on the details of the application; often there are fundamental incompatibilities between the physics of the depolarization mechanism and the optical system design. Therefore an SLD optical source that is intrinsically depolarized is needed.

A semiconductor optical amplifier (SOA) can potentially be used as a depolarized SLD. SOAs are compact semiconductor devices that can be made to operate over a wide wavelength range, for example to generate optically amplified signals in optical transmission systems. An SOA receives an input signal and amplifies the signal to a level which is typically on the order of 10 to 30 dB above the input signal strength on a single pass. One of the major challenges is to design and manufacture the SOA to amplify all polarization states with equal gain, that is, to be a "polarization insensitive" amplifier. When no input signal is applied to an SOA, light is still generated at both the input and output ports due to ASE. This ASE output has a spectrally broad emission profile that can be used as a superluminescent source. However, the ASE output from an SOA is typically limited in output power due to the design tradeoffs required to equalize the gain for both transverse electric (TE) and transverse magnetic (TM) polarization states. Also, the degree of polarization of the ASE output power is not sufficiently low due to finite differences between the TE and TM gain. That is, the SOA gain is not truly polarization insensitive especially not over a large optical bandwidth.

Although polarization insensitive SOAs have been developed, these devices can be complex and/or expensive to manufacture. Accordingly, there is a need to increase the ASE output power, and depolarize the ASE output power of an SOA (or reduce the degree of polarization) for use as a SLD.

SUMMARY

Systems and methods according to the present invention address this need and others by providing a depolarized superluminescent optical source formed by using a semiconductor optical amplifier, that amplifies light in only one polarization state, and polarization combining the amplified spontaneous emission from both ends of the semiconductor optical amplifier. The polarization combining can be achieved by using polarization maintaining optical fiber on the outputs of the SOA and polarization beam combining techniques. The degree of polarization can be made arbitrarily small by adjusting and balancing the output power in both SOA output fibers prior to the polarization beam combining.

According to another exemplary embodiment of the present invention, a depolarized superluminescent optical source is formed by using a semiconductor optical amplifier, that amplifies light in only one polarization state, and polarization combining the amplified spontaneous emission from both ends of the semiconductor optical amplifier. The polarization combining is achieved by using optical elements such as lenses, mirrors and polarization rotation plates to steer the light into a bi-refringent crystal type polarization beam combiner.

According to another exemplary embodiment of the present invention, a depolarized superluminescent optical source is formed by using a monolithically integrated semiconductor optical amplifier chip, that amplifies light in only one polarization state, including active waveguide sections and passive waveguides sections such that the light from both ends of the optical amplifier come out on the same side of the monolithic chip. Polarization combining can be achieved by using lenses to collimate the output beams, a polarization plate to rotate the polarization of one of the beams by 90 degrees, and a bi-refringent crystal type polarization beam combiner. Passive output mode transformers can be included to make the optical coupling to the polarization beam combiner more efficient or eliminate the collimating lens or lenses.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Figure 1A:
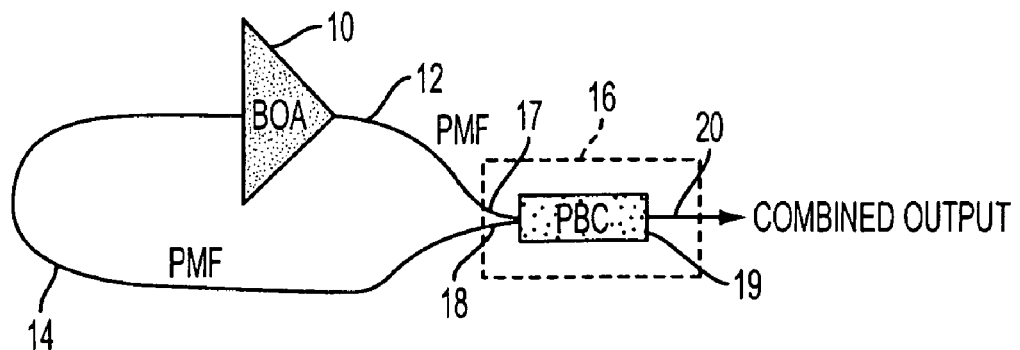
FIG. 1(a) depicts an exemplary SLD device according to an exemplary embodiment of the present invention.
Figure 1B:
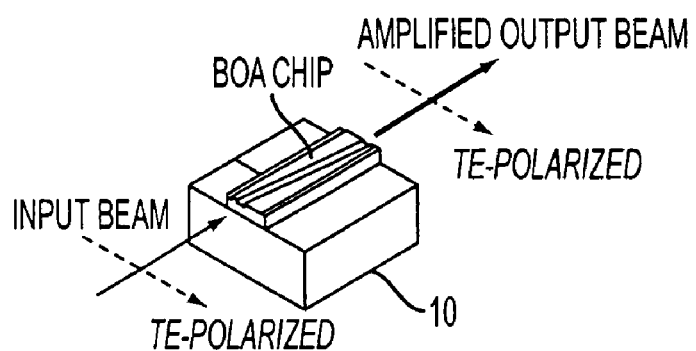
FIGS. 1(b) and 1(c) illustrate a BOA chip operating on a TE polarized input beam and a TM polarized input beam, respectively.
Figure 1C:
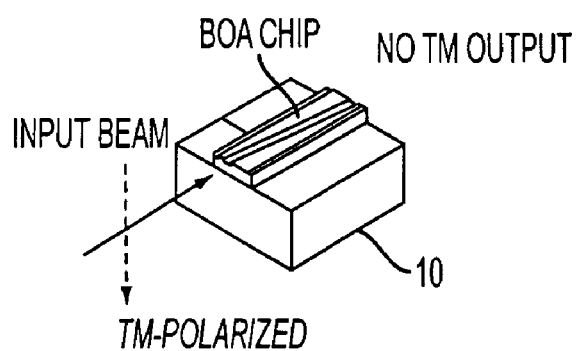

An exemplary method and device for improving the optical output power and minimizing the degree of polarization (DOP) of SLDs according to the present invention is shown in FIG. 1(a). Therein, a booster optical amplifier (BOA) 10 with access to both chip facets is employed. A BOA is identical to an SOA except that in the case of the BOA the semiconductor amplifier chip amplifies only one polarization state, whereas in a SOA the semiconductor amplifier chip amplifies both polarization states. As an example, in FIG. 1(b), an input beam of purely transverse electric (TE) polarized light entering a BOA 10, results in an amplified output beam of TE polarized light. On the other hand, referring to FIG. 1(c), an input beam of purely transverse magnetic (TM) polarized light entering a BOA 10 results in substantially no output TM light. In the context of this specification, a BOA represents an amplifier containing a BOA chip that amplifies only one linear polarization state, typically the TE polarization state and a SOA represents an amplifier that contains a SOA chip that amplifies both TE and TM linear polarization states. A complete, packaged BOA includes, for example, a BOA chip, input and output fiber collimators with polarization maintaining fibers (PMFs) and input and output collimating lenses. The BOA chip, lenses and optical fibers are attached to, or surrounded by, an enclosure. A thermoelectric cooler and thermistor are typically supplied in this enclosure to maintain the temperature of the BOA chip. A fiber collimator includes a collimating lens and fiber attached to the lens. The fiber collimator can be used in either direction, e.g., either (a) collimated light incident on the collimating lens is focused into the fiber, or (b) light coming from a fiber is collimated by the collimating lens and thus produces a collimating light source. Those skilled in the art will also appreciate that lensed PMF fiber can be used in place of lenses and fiber collimators.

Figure 2:
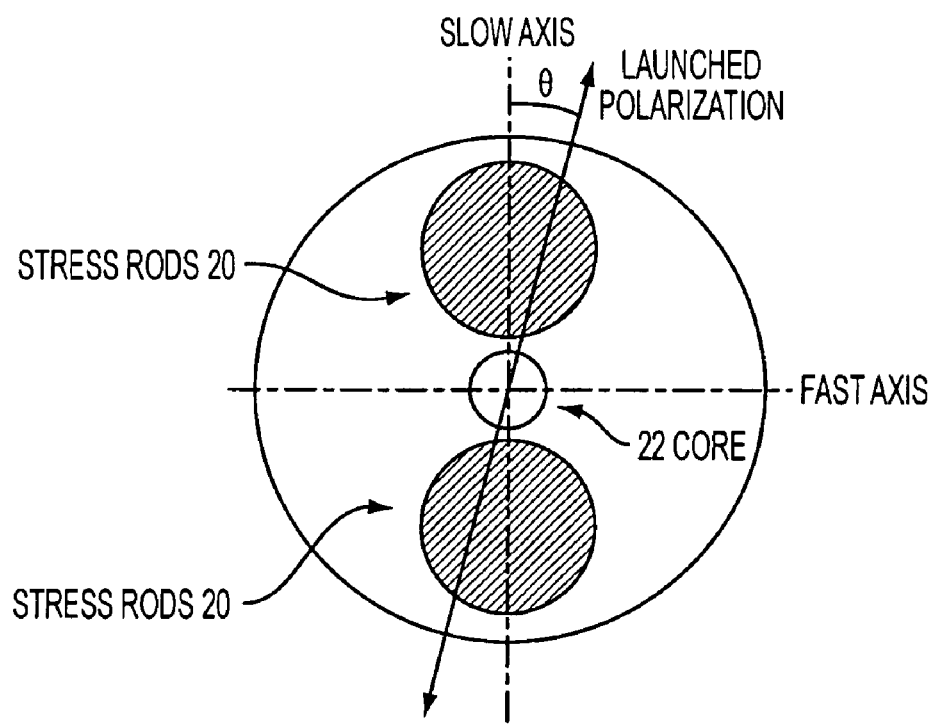
FIG. 2 depicts an exemplary polarization maintaining fiber (PMF) which can be used in exemplary embodiments of the present invention.

Amplified spontaneous emission (ASE) light collected from each side of the BOA 10 is coupled into, e.g., PANDA type, polarization maintaining fibers (PMF) 12 and 14. Those skilled in the art will appreciate that other types of PMFs are available and can be used instead of PANDA type. The PANDA type PMF has stress rods 20 on either side of the optical fiber core 22 as shown in FIG. 2. The stress rods 20 induce bi-refringence in the core 22 and create two principal transmission axes (a slow axis and a fast axis) within the optical fiber 12 and 14. Polarization launched in either of these two axes will be maintained throughout the optical fiber. Exemplary embodiments of the present invention described herein employ the slow axis as the principal transmission axis, however the fast axis may, alternately, be used as the principal transmission axis. The angular alignment of the slow axis relative to the horizontal plane determines the extinction ratio (ER) of the PMF 12 and 14 and is defined as:

$$ER = 10 \cdot \log \lfloor \tan^2 \theta \rfloor \qquad (1)$$

where θ denotes the angle between the launched polarization plane and the slow axis of the PMF 12 and 14 as shown in FIG. 2.

Figure 3:
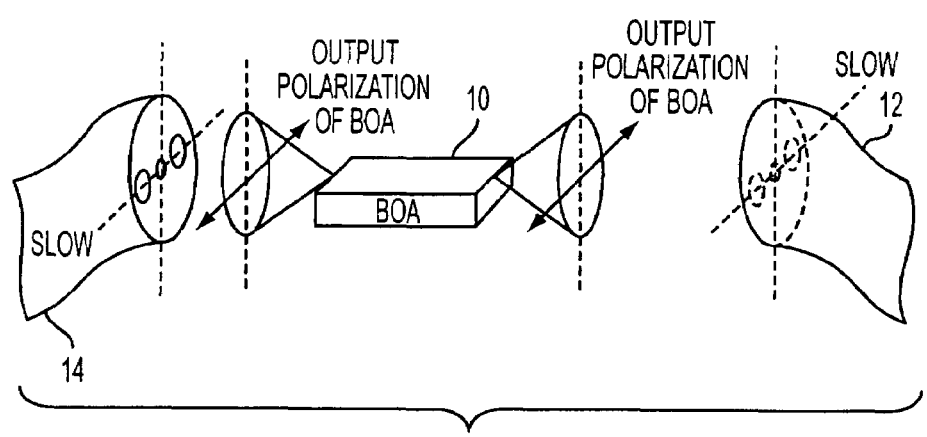
FIG. 3 illustrates orientation of PMFs relative to a polarization plane of a BOA according to an exemplary embodiment of the present invention.

The PMFs 12 and 14 on each side of the BOA are aligned such that the slow axis of the PMFs 12 and 14 are aligned with the horizontal (TE) plane of the BOA chip 18 as shown in FIG. 3. For simplicity of the diagram, the coupling optics disposed between the BOA chip 10 and the PMFs 12 and 14 have been omitted. Since the ASE from the BOA chip 10 is polarized, the ASE will propagate and maintain its polarization along the launched axis of the PMFs 12 and 14, i.e., along the slow axis of the PMFs 12 and 14 in this exemplary embodiment.

Returning to FIG. 1(a), after the PMFs 12 and 14 are correctly aligned with the BOA chip 10, they are then fusion spliced to a fiber coupled polarization beam combiner (PBC) 16. A typical, off-the-shelf PBC 16 is constructed with a PBC core 19, two input PMFs 17,18 and an output single mode fiber (SMF) 20. Polarized light propagating along the two input PMFs 17,18 are combined with minimal power loss into the SMF 20 via the PBC core 19. Within the PBC 16, the two input PMFs 17, 18 are aligned so that the polarization of the two light beams incident on the PBC core 19 will be orthogonal to each other. When these two light beams are combined by the PBC core 19, the light launched into the SMF 20 will be orthogonally polarized with some random phase between the light components. The efficiency of the power combining depends directly on the ER or angular alignment of individual PMFs 17, 18 relative to the PBC core 19. Each input will thus experience a different loss. The PBC 16 combines the power of its two inputs using polarization combining and, accordingly, there should not be any coherent effects other than residual crosstalk of polarizations due to imperfection during manufacturing of the PBC 16. For a broadband optical source similar, the coherence length is typically short. For example a typical superluminescent ASE spectrum has a full width at half maximum (FWHM or $\Delta\lambda$) of 40 nm, which corresponds to a coherence length $l_c$ of:

$$l_c = \frac{\lambda^2}{\Delta\lambda} \tag{2}$$

For $\lambda=1550$ nm and $\Delta\lambda=40$ nm, the coherence length equals 60 um. Thus if the path difference between the two PMFs (12,17;14,18) is greater than $l_c$, then the relative phase will appear random. This can be useful because in an ideal depolarized light source there is no phase coherence between orthogonal polarization states. Therefore, by inserting a mimimal amount of path length difference in the polarization combining PMF arms the resulting depolarized SLD behaves as an ideal depolarized source. Thus, according to some exemplary embodiments of the present invention, the path length of PMF 12 plus PMF 17 will be at least $l_c$ greater than the path length of PMF 14 plus PMF 18. However, since this feature is not critical, according to other exemplary embodiments the difference in the path lengths may be equal to or less than $l_c$.

The instantaneous vector representing the combined power can be written as:

$$\vec{E} = [\hat{\imath} E_x e^{i\phi_x} + \hat{\jmath} E_y e^{i\phi_y}] e^{i(kz - \omega t)} \tag{3}$$

where $E_x$ and $E_y$ are the relative amplitudes of the light propagating along the PMFs 12,17 and 14,18 and $\phi_x$ and $\phi_y$ are the phases of each component. The resulting state of polarization (SOP) of light propagating along the single mode fiber is determined by $E_x$, $E_y$, $\phi_x$ and $\phi_y$. If the relative phase between $E_x$ and $E_y$ is random then the SOP of the resultant E-field will be random as well, if the condition that $E_x$ equals $E_y$ holds. If $E_x$ and $E_y$ are equal then Equation 3 can be written in Jones vector form, $$\vec{E} = \tilde{E} e^{i(kz - \omega t)} \tag{4}$$

-continued $$\tilde{E} = E e^{i\varphi_x} \begin{bmatrix} 1 \\ e^{i\delta} \end{bmatrix}$$

with $\delta = \phi_y - \phi_x$, and $E = E_x = E_y$. The degree of polarization (DOP) is defined as $$DOP = \frac{P_{\max} - P_{\min}}{P_{\max} + P_{\min}} \tag{5}$$

with Pmin and Pmax representing the minimum and maximum power transmitted through the polarizer while it is rotated one full cycle respectively. For typical SLD applications it is desirable that the DOP<5%, which means that the power contribution from each of the PMFs 17 and 18 when combined should be matched to within 10% based on equation (5). Breaking this characteristic down further into the individual BOA and PBC components of the exemplary SLD embodiment of FIG. 1(a), the BOA output power from both sides of BOA 10 should be matched to within approximately 5% and the PBC insertion loss of PBC 16 for both polarization states should be matched to within approximately 5%. This can be accomplished by, for example, tuning the alignment of the PMF fibers 12 and 14 to the BOA chip 10.

Figure 4A:
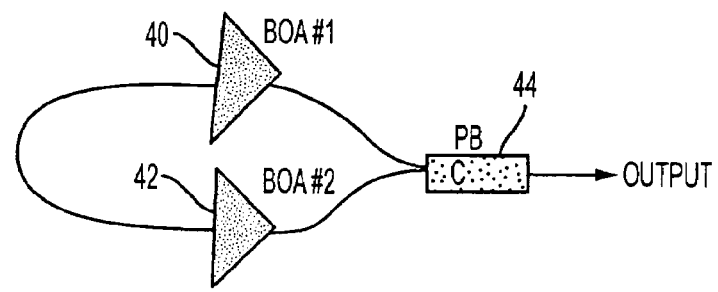
FIG. 4(a) depicts an SLD device according to another exemplary embodiment of the present invention using two BOAs.
Figure 4B:
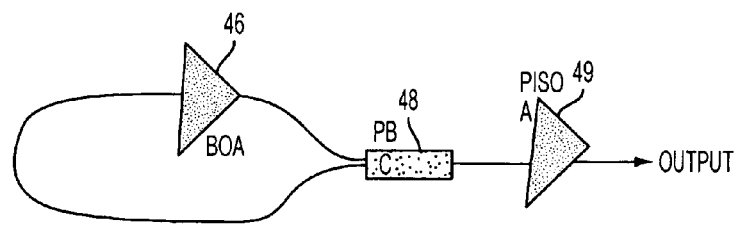
FIG. 4(b) shows an SLD device according to another exemplary embodiment of the present invention using a SOA.

Other exemplary embodiments of the present invention are illustrated in FIGS. 4(a) and 4(b). In FIG. 4(a), two BOAs 40 and 42 are arranged either in parallel (with input side PMFs connected together, as shown in FIG. 4(a)) or in series (e.g., with output PMF from BOA 40 connected to the input PMF of BOA 42, not shown). Both arrangements will operate in a similar manner since the BOAs 40 and 42 can be operated in either the forward or backward mode. ASE from the BOA 40 output side will be amplified by BOA 42 and the ASE from BOA 42 input side will be amplified by BOA 40. The amplified signal will then be combined via a PBC 44 to produce a low DOP SLD. In FIG. 4(b) a single BOA 46 and a PBC 48 is used to produce low DOP output and is then amplified by a polarization insensitive SOA 49. Both of the exemplary embodiments illustrated in FIGS. 4(a) and 4(b) enable higher output power by providing more optical gain and lower DOP because additional adjustments are available for power balancing. The exemplary embodiment in FIG. 4(a) is particularly attractive for lowering DOP because power balancing can be implemented by adjusting the current bias to BOA 40 and BOA 42. In fact, BOA 40 and BOA 42 could be implemented on a single BOA chip with separate bias control sections.

Figure 5:
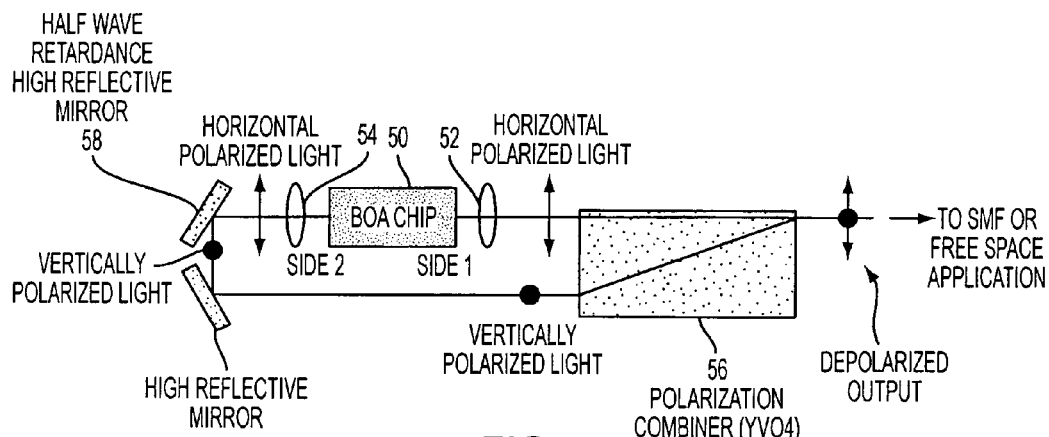
FIG. 5 illustrates an SLD device using micro-optics according to another exemplary embodiment of the present invention.

The above-described exemplary embodiments can employ discrete components with fiber coupled PBCs. However, those skilled in the art will appreciate that other configurations of the present invention can also be implemented by, for example, using monolithic semiconductor and/or integrated photonics technologies. A monolithic SLD according to exemplary embodiments can be built on an InP platform to similar performance e.g., in terms of output power and DOP, but at a significantly reduced size. Another exemplary embodiment of the present invention is shown in FIG. 5, which configuration is based on the techniques described above, but uses micro-optics which also provide the added benefit of small size. In the integrated micro-optics approach, optical components can be built on a silicon optical bench, for example. ASE from both sides of the BOA 50 are collimated via collimators 52 and 54 and is well polarized (due to the chip architecture) in the horizontal plane. Side 1 of the ASE is directed to a polarization beam combiner 56, which can, for example, be fabricated using material YVO4 or yttrium orthovanadate which is commonly known as vanadate. Side 2 of the ASE is routed to a high reflective mirror 58 with a coating that rotates the polarization of the incoming light by 90 degrees, thus making the light polarized in the vertical plane and orthogonal to the light output via side 1 of BOA 50. The outputs from both sides of the BOA 50 are then recombined at the PBC 56, resulting in a depolarized output since the phase between the two ASE will be random. The output can be used in free space or coupled to an SMF for fiber applications.

Figure 6:
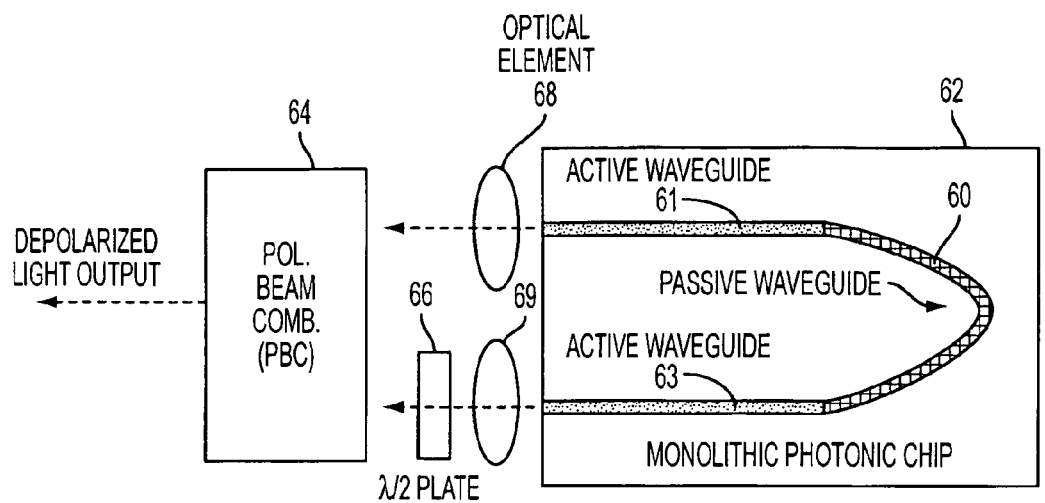
FIG. 6 depicts a monolithically integrated exemplary embodiment of the present invention.
Figure 7:
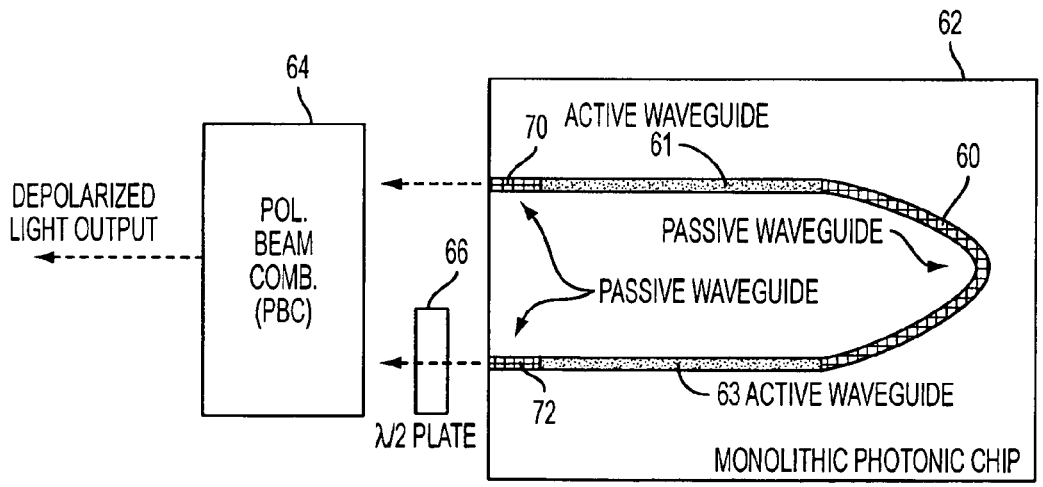
FIG. 7 shows another monolithically integrated exemplary embodiment of the present invention including passive waveguide mode transformers.
Figure 8:
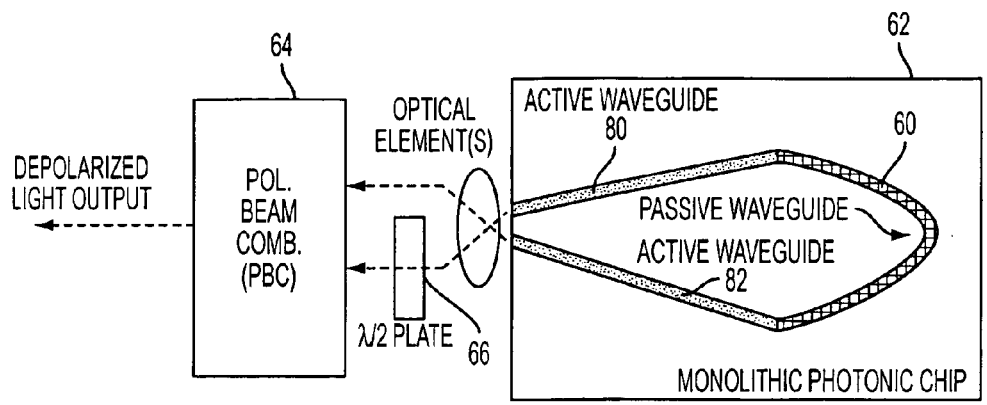
FIG. 8 shows yet another monolithically integrated exemplary embodiment of the present invention including angled facet output waveguides.
Figure 9:
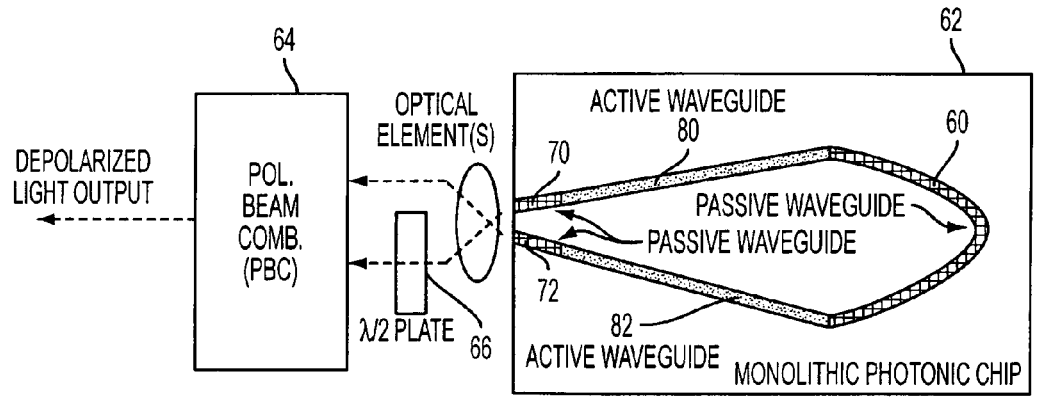
FIG. 9 depicts still another monolithically integrated exemplary embodiment of the present invention having both angled facet output waveguides and passive waveguide mode transformers.

Alternatively, the micro-optics approach can also be combined with a monolithically integrated optical amplifier chip which is designed to provide light output ports on only one side of the chip, according to other exemplary embodiments as shown in FIGS. 6–9. Referring first to FIG. 6, the passive waveguide 60 is designed to confine the light so that low optical loss waveguide bends can be made to turn the light 180 degrees, or fold back the light. The passive waveguide 60 enables the light from both ends of the optical amplifier 62 to emerge from only one side of the chip via active waveguides 61 and 63. The light output from one of the two active waveguides is passed through a λ/2 plate 66 such that when light from the two paths is combined at PBC 64, it emerges as a depolarized output. With a large enough output beam size, butt coupling without optical collimating lenses 68 and 69 can be achieved. This exemplary embodiment is illustrated in FIG. 7, wherein elements identified using the same reference numbers as used with respect to FIG. 6 operate in the same or a similar manner as described above. Therein, additional passive waveguides 70 and 72 are added at the output facets of the monolithic SOA chip 62 as mode transformers to tailor the output beam properties (e.g. make a larger optical beam and/or a more circular optical beam) to improve coupling efficiency to the polarization beam combiner 64. FIG. 8 illustrates another exemplary embodiment wherein angled facet output waveguides 80 and 82 are provided. FIG. 9 illustrates an SLD according to an exemplary embodiment of the present invention wherein both passive waveguide mode transformers 90 and 92 and angled facet output waveguides 94 and 96 are employed. The exemplary embodiments illustrated in FIGS. 8 and 9 are attractive because they enable the use of angled waveguides at the chip facet. The angled waveguide reduces the effective optical reflectivity at the facet so the requirements on the anti-reflection coatings are much less stringent which aids in making a manufacturable SLD.

There are many techniques which can be used to monolithically integrate passive and active waveguide sections on the same SOA chip, such as regrowth and selective area growth techniques. One exemplary embodiment employs "passive-active resonant coupling" (PARC) using a taper to efficiently couple the light between active and passive waveguide sections. More details regarding this type of integration technique using resonantly coupled devices per se can be found in U.S. Pat. No. 6,310,995 (the "'995 patent"), the disclosure of which is incorporated here by reference.

Exemplary embodiments of the present invention, as described herein, therefore include a depolarized superluminescent optical source formed by using a semiconductor optical amplifier, that amplifies light in only one polarization state, and polarization combining the amplified spontaneous emission from both ends of the semiconductor optical amplifier. The polarization combining is achieved by using polarization maintaining optical fiber on the outputs of the SOA and polarization beam combining techniques. The degree of polarization can be made arbitrarily small by adjusting and balancing the output power in both BOA output fibers prior to the polarization beam combining. This power balancing can be done for example in the alignment of the PMF fibers to the BOA chip or using current bias in separate BOA sections as indicated in FIG. 4(a).

Exemplary embodiments of the present invention further includes a depolarized superluminescent optical source formed by using a semiconductor optical amplifier, that amplifies light in only one polarization state, and polarization combining the amplified spontaneous emission from both ends of the semiconductor optical amplifier. The polarization combining is achieved by using optical elements such as lenses, mirrors and polarization rotation plates to steer the light into a bi-refringent crystal type polarization beam combiner. Exemplary embodiments of the present invention still further include a depolarized superluminescent optical source formed by using a monolithically integrated semiconductor optical amplifier chip, that amplifies light in only one polarization state, including active waveguide sections and passive waveguides sections such that the light from both ends of the optical amplifier come out on the same side of the monolithic chip. Polarization combining is achieved by e.g., providing a planar waveguide with a polarization rotator and polarization beam combiner. A more specific example uses lenses to collimate the output beams, a polarization plate to rotate the polarization of one of the beams by 90 degrees, and a bi-refringent crystal type polarization beam combiner. Passive output mode transformers can be included to make the optical coupling to the polarization beam combiner more efficient or eliminate the collimating lens or lenses.

According to another exemplary embodiment of the present invention, the BOA device 10 can be fabricated as two BOA chips, one disposed at a front facet of the package and the other disposed at the back facet of the package. One of the two BOA chips can be operated to output light along PMF 12 at a first wavelength, while the other of the two BOA chips can be operated to output light along PMF 14 at a second wavelength. The first and second wavelengths can be different. The two outputs are then combined by PBC 16 to generate a combined output with a broad spectrum.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A depolarized superluminescent optical source comprising:
   a semiconductor optical amplifier which amplifies light in substantially one polarization state having a first and a second end; and
   a polarization combining unit connected to both said first end and said second end of said semiconductor optical amplifier for combining amplified spontaneous emission from both said first end and said second end of the semiconductor optical amplifier.

2. The depolarized superluminescent optical source of claim 1, further comprising:
polarization maintaining optical fibers connecting the first and second ends of the semiconductor optical amplifier to said polarization combining unit.

3. The depolarized superluminescent optical source of claim 1, further comprising:
means for controlling a degree of polarization by adjusting an output power in said polarization maintaining optical fibers.

4. The depolarized superluminescent optical source of claim 1, wherein said polarization combining unit includes optical elements for steering said amplified spontaneous emission into a bi-refringent crystal type polarization beam combiner.

5. A depolarized superluminescent optical source comprising:
a monolithically integrated semiconductor optical amplifier chip, that amplifies light in substantially one polarization state, said chip including active waveguide sections and passive waveguide sections such that light from both ends of the optical amplifier come out on the same side of the monolithic chip; and
a polarization combining unit connected to said monolithically integrated semiconductor optical amplifier chip for combining amplified spontaneous emission therefrom.

6. The depolarized superluminescent optical source of claim 5, wherein said polarization combining unit includes lenses to collimate output beams, a polarization plate to rotate the polarization of one of the beams by 90 degrees, and a bi-refringent crystal type polarization beam combiner.

7. The depolarized superluminescent optical source of claim 1, wherein said semiconductor optical amplifier further comprises:
a first semiconductor optical amplifier chip operating to output light from said first end at a first wavelength; and
a second semiconductor optical amplifier chip operating to output light from said second end at a second wavelength,
wherein said polarization combining unit combines said light at said first wavelength and said light at said second wavelength to generate a combined output.

8. The depolarized superluminescent optical source of claim 7, wherein said first wavelength and said second wavelength are different.

9. The depolarized superluminescent optical source of claim 1, wherein said semiconductor optical amplifier further comprises:
a first semiconductor optical amplifier and a second semiconductor amplifier connected together.

10. The depolarized superluminescent optical source of claim 9, wherein said first and second semiconductor optical amplifiers are connected together in series.

11. The depolarized superluminescent optical source of claim 9, wherein said first and second semiconductor optical amplifiers are connected together in parallel.

12. The depolarized superluminescent optical source of claim 9, wherein said first and second semiconductor optical amplifiers have independently controlled injection currents.

13. The depolarized superluminescent optical source of claim 1, further comprising:
another semiconductor optical amplifier for amplifying said combined amplified spontaneous emission, wherein said another semiconductor optical amplifier is polarization insensitive.

14. The depolarized superluminescent optical source of claim 2, wherein said polarization maintaining fibers include a first polarization maintaining fiber connecting said first end of the semiconductor optical amplifier to said polarization combining unit, a second polarization maintaining fiber connected said second end of the semiconductor optical amplifier to said polarization combining unit, a third polarization maintaining fiber connecting said first polarization fiber to a polarization beam combining core, and a fourth polarization maintaining fiber connecting said second polarization maintaining fiber to said polarization beam combining core, wherein a first length associated with said first and third polarization maintaining fibers is more than a coherence length longer than a second length associated with said second and fourth polarization maintaining fibers.

15. The depolarized superluminescent optical source of claim 5, wherein said passive waveguide sections include a curved waveguide section connecting a first active waveguide to a second active waveguide.

16. The depolarized superluminescent optical source of claim 5, wherein said passive waveguide sections include a first passive waveguide interposed between said same side of said monolithic chip and a first active waveguide and a second passive waveguide interposed between said same side of said monolithic chip and a second active waveguide.

17. The depolarized superluminescent optical source of claim 5, wherein said active waveguide sections intersect said side of said monolithic chip at an angle.

18. The depolarized superluminescent optical source of claim 16, wherein said first and second passive waveguides intersect said side of said monolithic chip at an angle.

19. The depolarized superluminescent optical source of claim 9, wherein said first and second semiconductor optical amplifiers are disposed on the same chip.

* * * * *